US007765445B2

(12) United States Patent
Eckelman et al.

(10) Patent No.: US 7,765,445 B2
(45) Date of Patent: Jul. 27, 2010

(54) ANALOG TESTING OF RING OSCILLATORS USING BUILT-IN SELF TEST APPARATUS

(75) Inventors: Joseph E. Eckelman, Hopewell Junction, NY (US); Kevin C. Gotze, Aloha, OR (US); James A. Kyle, Germantown, NY (US); Jennifer Yuk Sim Yan, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 340 days.

(21) Appl. No.: 12/032,649

(22) Filed: Feb. 16, 2008

(65) Prior Publication Data

US 2009/0210760 A1     Aug. 20, 2009

(51) Int. Cl.
    *G01R 31/28* (2006.01)
(52) U.S. Cl. ........................ 714/726; 714/731; 714/733
(58) Field of Classification Search ................ 331/1 A, 331/45; 341/157; 324/76.54; 714/726, 731, 714/733
    See application file for complete search history.

(56) References Cited

U.S. PATENT DOCUMENTS

| | | | |
|---|---|---|---|
| 4,902,986 A | | 2/1990 | Lesmeister |
| 5,045,811 A | * | 9/1991 | Lewis ......................... 331/1 A |
| 5,233,316 A | * | 8/1993 | Yamada et al. ................ 331/45 |
| 5,546,406 A | | 8/1996 | Gillenwater et al. |
| 5,790,479 A | | 8/1998 | Conn |
| 6,204,694 B1 | | 3/2001 | Sunter et al. |
| 6,307,496 B1 | * | 10/2001 | Ikuta et al. ................... 341/155 |
| 6,493,279 B2 | | 12/2002 | Sato et al. |
| 6,502,050 B1 | | 12/2002 | Chan |
| 7,039,842 B1 | | 5/2006 | Whitten et al. |
| 7,315,270 B2 | * | 1/2008 | Maksimovic et al. ....... 341/157 |
| 7,519,888 B2 | * | 4/2009 | Tabatabaei et al. .......... 714/733 |
| 7,622,908 B2 | * | 11/2009 | Kwak ...................... 324/76.54 |

OTHER PUBLICATIONS

"A built-in Self-test scheme for differential ring oscillators", Dermemtzoglou, L. (IEEE, Proceedings, 6th International Syposium on Quality Electronic Design, pp. 448-452), 2005.

* cited by examiner

*Primary Examiner*—David Ton
(74) *Attorney, Agent, or Firm*—William A. Kinnaman, Jr.

(57) ABSTRACT

System-accessible frequency measuring circuits and procedures permit on-chip testing of the oscillators and provide test results observable off chip via LSSD scan paths. This allows a rapid ensemble of ring oscillators in a standard ASIC test flow without the need for on chip analog test equipment (the test apparatus has effectively been created on device and can be digitally configured, operated and read). Frequency measuring logic that can 1) functionally operate to measure the frequency of the ring oscillators; 2) participate in traditional logical tests such as LSSD and LBIST to verify that the circuit is manufactured correctly and is likely to operate and 3) operate in a special ring-oscillator test mode, that allows the logic to operate on a tester very similarly to the way it does functionally. In this mode, the frequency measuring logic can be scanned to a specific state, started by pulsing a digital I/O, and the measured analog value can be scanned out sometime later after the test has completed. Test interrogations are distributed on-chip through an LSSD shift register chain to individually evaluate each of a plurality of the oscillators.

20 Claims, 4 Drawing Sheets

ANALOG TESTING OF RING OSCILLATORS USING BUILT-IN SELF TEST APPARATUS

FIELD OF THE INVENTION

The present invention relates to ring oscillators embedded in complex logic circuits embodied in large scale integration (LSI) and very large scale integration (VLSI) circuit devices and more particularly, to the diagnosing of such ring oscillators.

BACKGROUND OF THE INVENTION

Ring oscillators are analog circuits created out of an odd number of inverting stages used to measure various physical parameters. The oscillators are designed such that the frequency period of oscillation correlates well with the physical parameter being measured. Historically, these circuits were only attached to chip IO but recently they have been embedded in chip circuitry to make them system-accessible for various purposes. In the past in order to test measure ring oscillators, special off chip analog test equipment capable of performing as an oscilloscope and spectrum analyzer was used to measure the speed of the oscillator. The use of the prior art of the off chip analog test equipment to measure oscillator speeds is a tedious, inaccurate and inefficient method of interactively testing each of a number of embedded ring oscillators individually and requires excessive test time and complex test software support algorithms. Further, the analog testing sequences and test results are incompatible with the chip I/O circuits. Adding analog support functions to each of the oscillator circuits to enable their testing would be one approach, but this would also result in excessive chip real estate and energy consumption.

Currently, VLSI devices incorporate structure to perform digital on-chip test functions. These built-in test and diagnostic functions are based on several Design for Test (DFT) techniques using scan chains testing techniques, such as Level Sensitive Scan Design (LSSD) using associated Logic & Array Built-in-self-test (LBIST & ABIST) devices, on-product-clock-generation (OPCG) techniques, and similar devices and techniques. Many of the BIST designs are further based on Signature Analysis (SA) concepts as response data compression methods. As described by E. B. Eichelberger and T. W. Williams in an article entitled "A Logic Design Structure for LSI Testability" on pages 462-468 of the Proceedings of the 14th Design Automation conf., LSSD rules impose a clocked structure on logic circuit memory elements such as latches and registers and require these memory elements be tied together to form a shift register scan path so that they are accessible for use as test input and output points. Therefore, digital test input signals can be introduced or digital test results observed wherever one of the memory elements occurs in the logic circuit. Being able to enter the logic circuit at any memory element for introducing test signals or observing test results, allows the combinational and sequential logic to be treated as much simpler combinational logic for testing purposes thus considerably simplifying test generation and analysis. Patents describing LSSD and built-in self test techniques include U.S. Pat. No. 3,783,254; No. 3,784,907; No. 3,961,252 No. 4,513,418, No. 6,181,614, No. 5,805,789, No. 5,659,551 and No. 5,659,551. The subject matter of these patents are hereby included by reference.

BRIEF DESCRIPTION OF THE INVENTION

In accordance with the present invention, new system-accessible frequency measuring circuits and procedures are provided that permits on chip testing of the oscillators and provide test results observable off chip via LSSD scan paths. This allows rapid measurement of an ensemble of ring oscillators in a standard ASIC test flow procedure without the need for on chip analog test equipment (the testing apparatus has effectively been created on device and can be digitally configured, operated and read). Frequency measuring logic that can 1) functionally operate to measure the frequency of the ring oscillators; 2) participate in traditional logical tests such as LSSD and LBIST to verify that the circuit is manufactured correctly and is likely to operate and 3) operate in a special ring-oscillator test mode, that allows the logic to operate on a tester very similarly to the way it does functionally. In this mode, the frequency measuring logic can be scanned to a specific state, started by pulsing a digital I/O, and the measured analog value can be scanned out sometime later after the test has completed. Test interrogations are distributed on-chip through an LSSD shift register chain to individually evaluate each of a plurality of the oscillators.

Therefore it is an object of the present invention to provide improved oscillator on chip testing apparatus and procedures.

It is another object of the invention to provide oscillator speed tests using LSSD paths to provide I/O compatible off chip results.

It is a further object of the invention to provide a single on chip set of test circuits using LSSD paths to perform individual speed tests on a plurality of oscillators.

DESCRIPTION OF THE DRAWINGS

These and other objects of the invention are best understood by reading the following description of various embodiments of the invention while making reference to the accompanying figures of which.

DETAILED DESCRIPTION OF AN EMBODIMENT OF THE INVENTION

Figure 1:
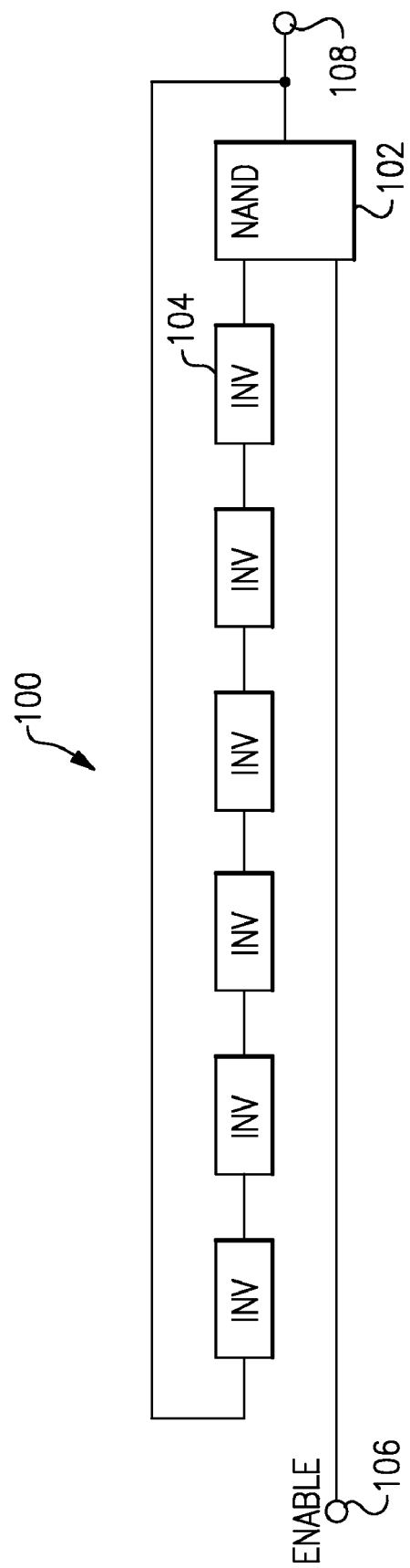
FIG. 1 is a diagram of a typical ring oscillator.

As shown in FIG. 1, a ring oscillator 100 comprises an inverting NAND circuit 102 and a positive plurality of inverter circuits 104. Upon application of a positive select signal 106, this ring oscillator with an odd plurality of inverting stages 102 and 104 oscillates providing an oscillating output or ringout signal 108. When the positive select signal is removed, the oscillation stops.

Figure 2:
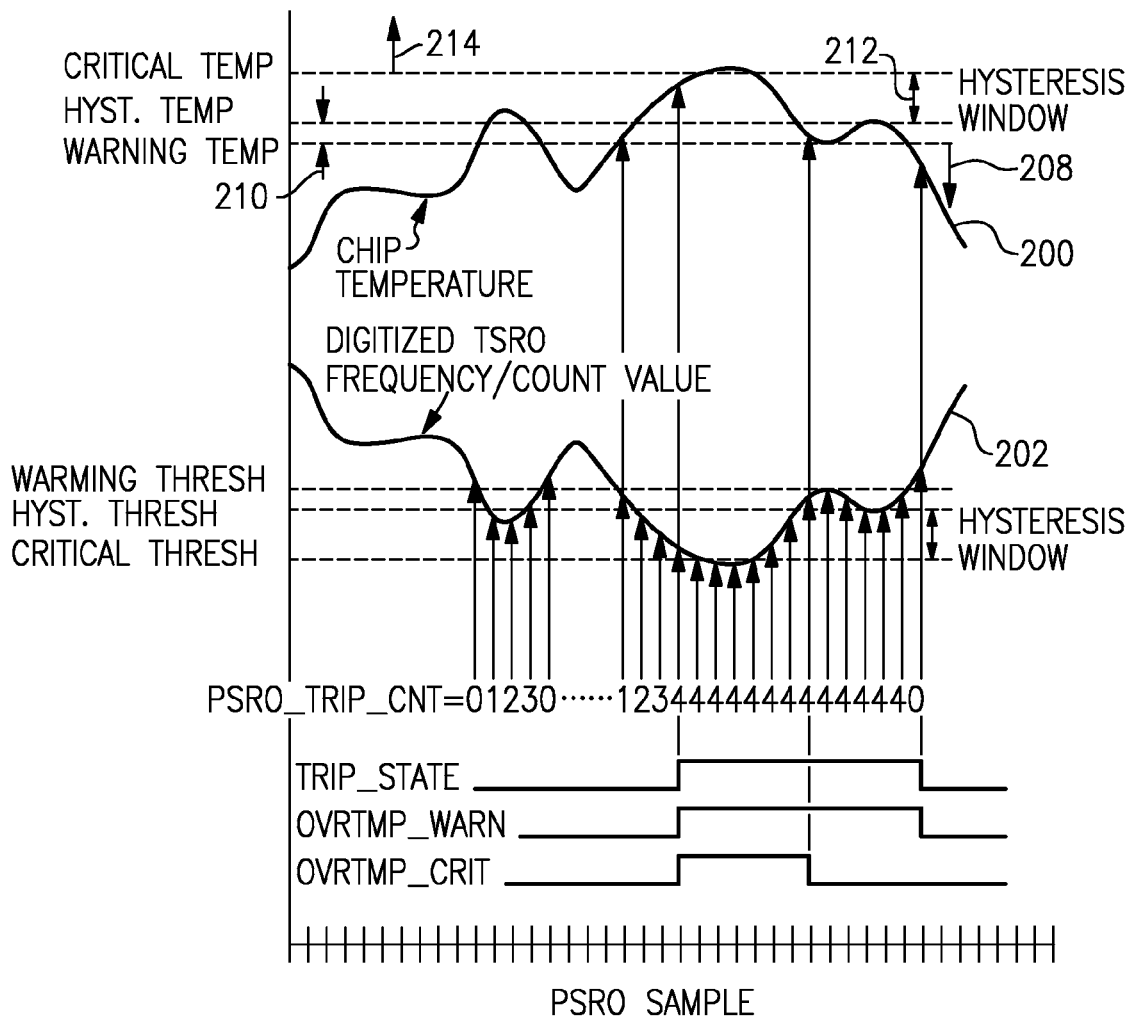
FIG. 2 is a response of the oscillator indicating various operating and critical operating stages for the oscillator of FIG. 1.

As shown in FIG. 2, the oscillating frequency of the oscillator reflects the temperature of an adjacent portion of an embedding semiconductor chip. The line 200 is illustrative of a locus of possible operating temperatures of the chip while line 102 shows how the operating frequency of the oscillator 100 reflects the operating temperature of the surrounding portion of the chip. It is noted that the frequency of the oscillator 100 varies inversely with the temperature of the chip. That is, as the temperature of the chip increases the frequency of oscillation of the oscillator decreases.

Figure 3:
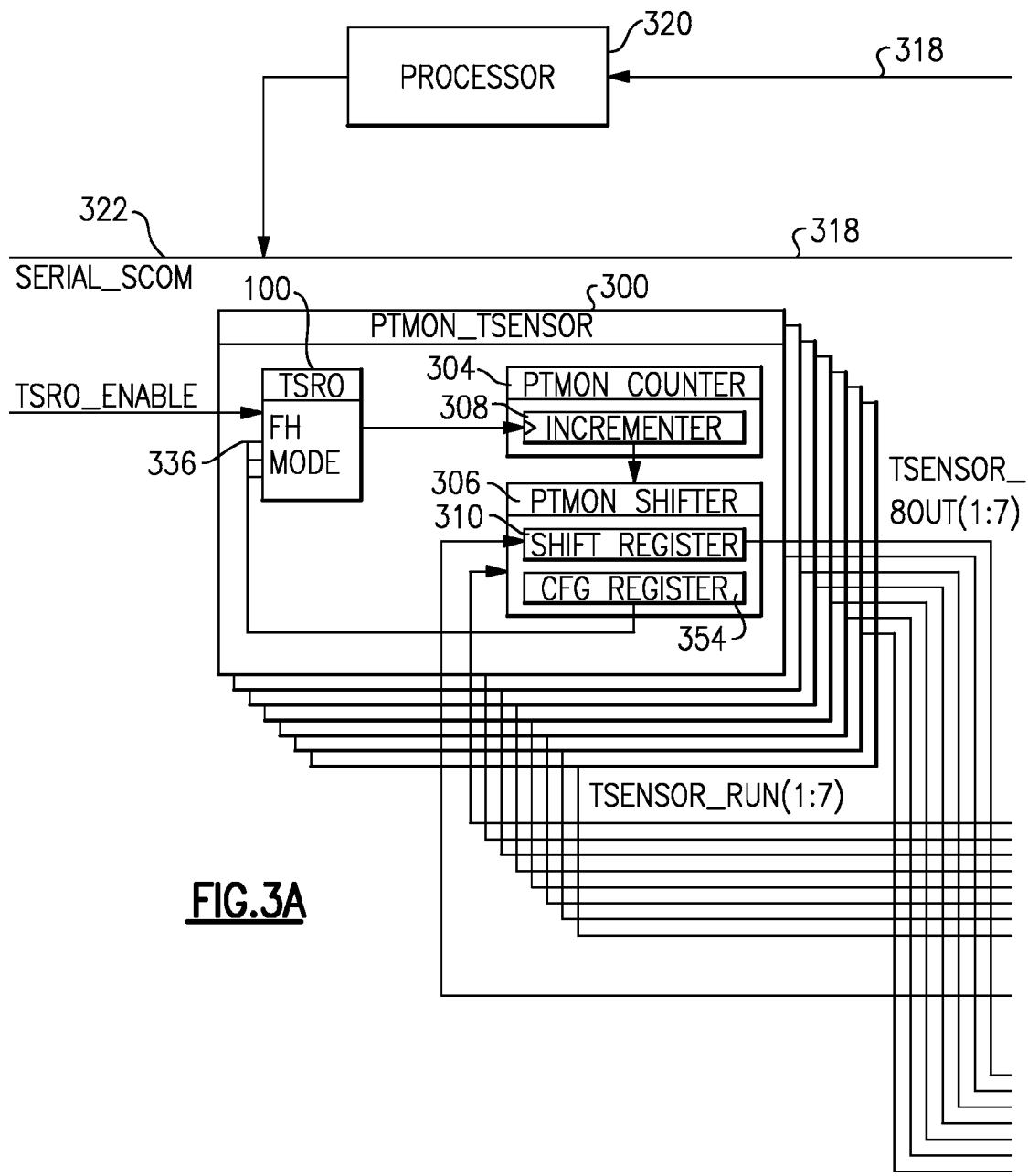
FIG. 3 is a schematic of the present invention incorporating a plurality of ring oscillators into a LSSD testing configuration.
Figure 3:
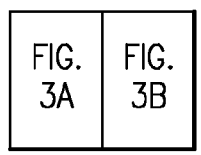
Figure 3B:
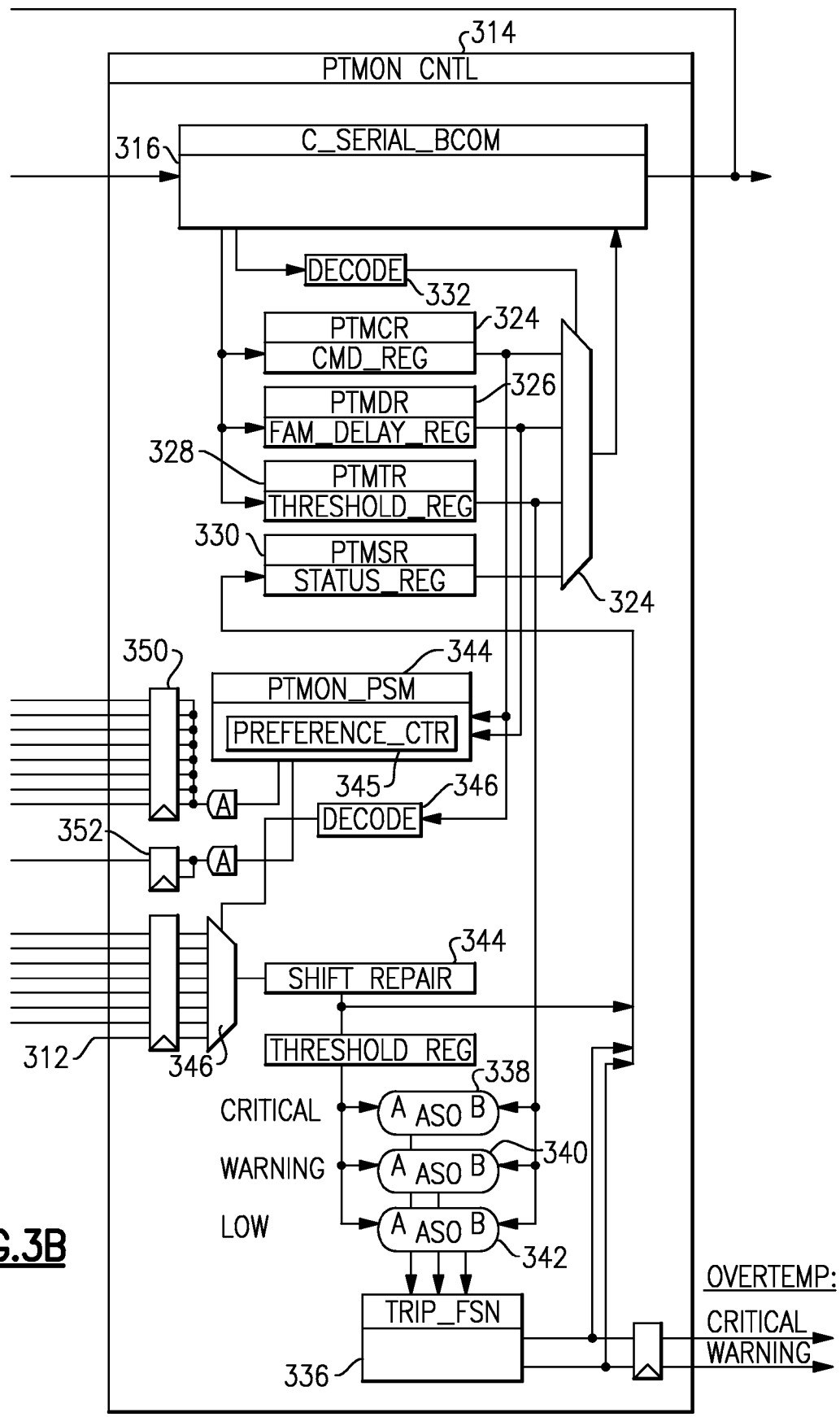

FIG. 3 shows a plurality of these temperature sensitive oscillators (TRSOs) 100 each contained in a separate process and thermal sample control temperature (PTMON) temperature sensor (TSENSOR) 300 each receiving a separate enable signal 100. Each TSENSOR 300 also contains a PTMON counter 304 and a PTMON shifter 306.

The PTMON counter contains an incrementer 308. Upon activation of a particular TSENSOR, the oscillating output or ringout 108 of a particular TSRO 100 is entered into its incrementer 308 that functions as a pulse counter. As shown in FIG. 2, the PTMON incrementer 308 digitizes the oscillators analog ringout 108 by counting the number of pulses occurring in preset sample periods 204. As pointed out previously, the frequency of the ringouot decreases as the temperature rises. The numbers 0 to 4 do not represent the count during PSRO sample periods 306 but indicate which temperature range the oscillator is operating. That is, whether the temperature is in its preferred operating range 208, the range 210 between the warning temperature and the hysteresis temperature, the hysteresis window range 212 or above the critical temperature 214. As shall be described hereafter, a hysteresis period indicates the critical range until it is clear that the temperature is back in its operating range 208.

The output incrementers are fed to a shift register 310 in the shifter 306. The outputs of the shift register 310 in each of the TSENSORS 300 is coupled to a register 312 in PTMON control unit 314. The PTMON control unit 314 is operated by a serial signals fed to a PITMAN serial-scan register 316 made up of stages of a LSSD chain 318. The serial signals data and software come directly from an off chip or processor 320 through an intervening local chip processor. In either case, the data and software are compatible with chip and processor circuits and software as are the results obtained by the PTMON control unit to notify the processor 320 of the status of the oscillator 100.

The software and data of the serial SCOM signals 322 entered into the PTMON scan register control the operation of four registers 324, 326, 328 and 330 in the control unit 314 through decode signals 332 controlling a MUX 334. A command register 324 is provided commands to select a particular TRSO 100 to be tested and its mode 336 of operation through a TSENSOR RUN signal. The threshold register 328 provides threshold levels to the critical warning and low temperature comparators 338, 340 and 342, respectively. These threshold levels are compared with the output of the selected TSRO oscillator results read into shift register 334 from MUX 346 and then into the threshold register 344. The contents of threshold register 344 is compared to the reference values in comparators 338 to 342. These reference values then determine whether the chip is operating in its normal, critical or low temperature states. The output of the shift register is also sent to the status register 334 and loaded back into the LSSD chain to determine if the appropriate level of the signal is being provided by TRSO.

The PTMON_CONTROL unit 314 controls all of the process and thermal sensor units through TSENSOR-RUN, TSENSOR-SIN and TSENSOR OUT signals, the CONTROL unit 314 can reset, enable, disable and then sample the ring oscillator digitalization logic within each of the TSENSOR units 300 by accessing the units with these signals.

The PTMON command register can provide CONTROL unit 314 operation in a number of states (IDLE, POLL, INIT, SAMPLE, RUN) through instructions provided through the PTMON FSM 344 and decode select signals provided through decoder 346 to provide TSENSOR RUN signals from register 350. TSENSOR SIN signals from registers and select TSENSOR OUT responses from decoder 346.

Associated with each state except IDLE and SAMPLE is a delay value provided from the delay register 326 to the reference counter 348 to provide how long the controller 314 should remain in each state.

The POLL operation is used to find out how many TSENSOR units are present. This state simply places a high level on the TSENSOR_SIN for all the TSENSORS 300 signal, waits for 64 cycles, and then samples the SENSOR_SOUT serial outputs of the registers 310 in all TSENSOR units with serially occurring TSENSOR IN signals from register 352 and decode signals to decode 346.

The INIT operation is used to configure the delay/and/mode information for the TSRO's 100. This operation shifts out the configuration data to all of the TSENSOR units, and then sets the tsensor_run signal active for two clock cycles to transfer the data from the serial shift registers 310 into a static configuration register 354 in each TSENSOR unit. Note that ALL tsensors are programmed simultaneously.

The ENABLE operation sets the appropriate TSRO ENABLE signal high and then waits for the ring oscillator output to stabilize.

The RUN state is where the 12-bit incrementer 308 in the PTMOM_COUNTER 304 is enabled to count the ring oscillator output strobes for the TSRO output digitalization operation.

The WAIT state allows the ring oscillator output incrementer to stabilize.

The SAMPLE state is where the controller asserts the "sensor_run" signal for 1 clock cycle, causing the serial shift register within the PTMOM_SHIFTER unit 306 to be loaded with the incrementer count value.

The SHIFT state is where the controller waits for the start and stop bits in the serial data stream from a TSENSOR UNIT to become properly aligned to capture the count information from the sensor unit counter register 350.

The over temperature detection function is comprises of three sub-functions:
Temperature Threshold Definition and Comparison;
Over temperature Detection (TRIP) State Machine;
Over temperature Reporting Logic.

As pointed out previously, the TSRO count values obtained from the TSENSOR units 300 are a digital representation of the frequency of TSRO output signals. As the chip's temperature rises, the logic delays will increase, causing the frequency of the TSRO output to decrease. Therefore, an inverse relationship exists between the sensed count value and temperature: as temperature increases, the TSRO counter value will decrease.

The threshold control logic has three programmable thresholds:
A. An overtemp warning threshold;
B. Critical overtemp threshold; and
C. A low/hysteresis temperature threshold.

Binary comparators 338 to 342 compare three 12-bit threshold count values to each sensor/sampled TSRO counter value. If the TSRO counter value is less than or equal to the programmed threshold value, a corresponding "over threshold" signal is asserted. The over temperature detection state machine responds to the three "over threshold" signals and may generate a warning or critical overtemp error to the chips fault isolation register (FIR).

The following is the relationship between threshold values:
A. Warning threshold count value is greater than the critical threshold count value;
B. Low/hysteresis threshold count value is greater than the critical threshold count value.

This is because of the inverse relationship between temperature and the digital TSRO representation.

To avoid triggering a fault in the event of a momentary over temperature condition, a threshold detect "trip" state machine has been implemented to provide a programmable hysteresis capability. With this capability, an over temperature condition must persist for a certain programmable number of cycles before the over temperature trip point condition is deemed valid and reported to the fault isolation logic.

A hysteresis counter is used to record the number of consecutive samples that the warning_overthreshold signal is active. The counter will continue to increment as long as the warning_overthreshold condition persists. Any sample in which the warning_overthreshold is not active will cause the hysteresis counter to be reset to zero.

When the hysteresis counter reaches a programmable maximum value, the over temperature "trip point" is satisfied, and the state machine will enter one of two trip states. If at the time the trip point is reach the critical_overthreshold signal is active, the critical overtemp state is entered (ref point 1). Otherwise, the warning overtemp state is entered.

When the trip state machine is in the warning overtemp state, if the temperature continues to rise to the point that the critical_overthreshold signal becomes active, the trip state machine will transition to the critical overtemp state. If the temperature decreases, the trip state machine will remain in the warning overtemp state until the warning_overthreshold signal becomes active, at which point the machine will return to the idle/enable state.

Once the trip state machine has entered the critical overtemp state, it will remain in that state until the temperature has dropped below the low/hysteresis temperature threshold. Once the hysteresis_overthreshold signal is inactive, if the warning_overthreshold signal is still active, the machine will transition to the warning overtemp state. Otherwise, it will return idle/enables state.

As long as the low_overthreshold signal is active, the overtemp state will be held active. Once the low_overthreshold signal goes inactive, the overtemp condition will have abated and the state machine will return to the idle/enabled state.

When the temperature detection state machine is tripped, (i.e. Enters in either warning or critical overtemp states), a fault event is reported to the fault isolation logic. If the PTMOM fault is reset, no further faults will be generated unless the over temperature condition abates and then reoccurs (i.e., the detection state machine trips a second time). The status register allows system firmware to see the real-time state of the detection state machine to determine if the overtemp condition has abated.

The foregoing discussion discloses and describes exemplary embodiments of the present invention. One skilled in the art will readily recognize from such discussion, and from the accompanying drawings and claims, that various changes, modifications and variations can be made therein. For instance, the invention has been described in terms of the oscillator is used to sense temperature change. The oscillators can be used to track other physical phenomena. Therefore it should be understood that the present invention is limited to the described embodiment but all embodiments within the spirit and scope of the invention, as defined in the following claims.

What is claimed is:

1. A method of testing oscillators with analog outputs embedded in digital circuits embedded in a semiconductor chip comprising:
   providing a plurality of sensing units each including a separate one of the oscillators;
   providing a plurality of stages of a LSSD chain within a control station;
   feeding control signals down the LSSD chain from a processor to the plurality of stages; and
   providing apparatus within the control station and the sensing units to digitize the analog output of the oscillators and placing the digitized analog outputs back into the stages of the LSSD chain for transferring along the LSSD chain to the processor for analysis.

2. The method of claim 1, including providing a separate incrementer in each of the sensing units for digitizing the analog output of the oscillator.

3. The method of claim 2, providing registers within the control station for receipt of data and instructions loaded into the stages of the LSSD chain from the processor.

4. The method of claim 3, providing an output register responsive to the instructions loaded into an input register to place the incremented output of the analog oscillator of a selected sensing unit into the stages of the LSSD chain in the control unit.

5. The method of claim 4, providing a shift register in each of the sensors for receiving the output of the incrementer for transfer to the control unit.

6. The method of claim 5, wherein the input registers include a command register for receiving instructions from the stages of the LSSD chain and a threshold register for receiving threshold limits for analyzing the output of the shift register to determine if the oscillator is working correctly.

7. The method of claim 6, including providing comparators for comparing the output of the shift registers to the outputs of the shift registers for each of the sensors to determine the operating range of the oscillator in the sensor.

8. The method of claim 7, wherein the operating ranges are critical, warning and low ranges, each range compared against the output of the sensing unit registers to provide a determination of whether the oscillator in a sensing unit is operating in a preferred low range, the warning range or the critical range.

9. The method of claim 8, including feeding the outputs of the comparators are all fed to a hysteresis module to assure that a detected actual critical state has been maintained for more than a set number of readings or a particular sensing shift register.

10. The method of claim 9, including placing the output of the hysteresis module into the output status register along with a corresponding output of each sensing unit shift register.

11. Apparatus for testing oscillators with analog outputs embedded in digital circuits embedded in a semiconductor chip comprising:
    a plurality of sensing units each including a separate one of the oscillators;
    a plurality of stages of a LSSD chain within a control station feeding control signals down the LSSD chain from a processor to the plurality of stages; and
    apparatus within the control station and the sensing units to digitize the analog outputs of the oscillators and placing the digitized analog outputs back into the stages of the LSSD chain for transferring along the LSSD chain to the processor for analysis.

12. The apparatus of claim 11, including a separate incrementer in each of the sensing units for digitizing the analog output of the oscillator in that unit.

13. The apparatus of claim 12, providing registers within the control station for receipt of data and instructions loaded into the stages of the LSSD chain from the processor.

14. The apparatus of claim 13, an output register responsive to the instructions loaded into an input register to place the incremented output of the analog oscillator of a selected sensing unit into the stages of the LSSD chain in the control unit.

15. The method of claim 14, a shift register in each of the sensors for receiving the output of the incrementer for transfer to the control unit.

16. The apparatus of claim 15, wherein the input registers include a command register for receiving instructions from the stages of the LSSD chain and a threshold register for receiving threshold limits for analyzing the output of the shift register to determine if the oscillator is working correctly.

17. The apparatus of claim 16, including comparators for comparing the output of the shift registers to the outputs of the shift registers for each of the sensors to determine the operating range of the oscillator in the sensor.

18. The apparatus of claim 17, wherein the operating ranges are critical, warning and low ranges, each range compared against the output of the sensing unit registers to provide a determination of whether the oscillator in a sensing unit is operating in a preferred low range, the warning range or the critical range.

19. A computer program product on a computer readable medium for testing analog oscillators embedded in a semiconductor chip on a plurality of sensing units each including a separate one of the oscillators comprising:

computer code for feeding control signals down an LSSD chain through chip I/O from any off chip processor to a plurality of stages in a control unit; and computer code for apparatus within the control station and the sensing units to digitize the output of the analog oscillators and placing the digitized analog signals back into the stages of the LSSD chain for transferring along the LSSD chain to the off chip processor for analysis.

20. The computer program product of claim 19 is at least one of tangible optical or magnetic media.

* * * * *